United States Patent

Desu et al.

[11] Patent Number: 5,873,977
[45] Date of Patent: Feb. 23, 1999

[54] DRY ETCHING OF LAYER STRUCTURE OXIDES

[75] Inventors: Seshu B. Desu; Wei Pan, both of Blacksburg, Va.

[73] Assignees: Sharp Kabushiki Kaisha, Osaka, Japan; Virginia Tech Intellectual Properties, Inc., Blacksburg, Va.

[21] Appl. No.: 393,233

[22] Filed: Feb. 22, 1995

Related U.S. Application Data

[63] Continuation-in-part of Ser. No. 300,176, Sep. 2, 1994, abandoned, Ser. No. 300,177, Sep. 2, 1994, abandoned, and Ser. No. 300,339, Sep. 2, 1994, Pat. No. 5,478,610.

[51] Int. Cl.$^6$ .................................................. H01L 21/00
[52] U.S. Cl. ............................ 156/643.1; 156/646.1; 216/67
[58] Field of Search ........................ 156/643.1, 646.1; 216/67; 365/145

[56] References Cited

U.S. PATENT DOCUMENTS

| | | | |
|---|---|---|---|
| 4,978,646 | 12/1990 | Bardhan et al. | 501/134 |
| 5,310,989 | 5/1994 | Russell et al. | 219/121.68 |
| 5,368,687 | 11/1994 | Sandhu et al. | 156/664 |
| 5,468,342 | 11/1995 | Nulty et al. | 156/643.1 |

OTHER PUBLICATIONS

E.C. Subbarao, J. Phys. Chem. Solids vol. 23, 1962, p. 665.

*Primary Examiner*—R. Bruce Breneman
*Assistant Examiner*—Luz Alejandro
*Attorney, Agent, or Firm*—Gibson, Dunn & Crutcher LLP

[57] ABSTRACT

A method of patterning layered structure oxide thin films involving placing the layered structure thin film (with or without a mask) laid on a substrate into a chamber which is partially filled with $CHClFCF_3$ gas and producing a glow discharge to cause the etching of the thin film ferroelectric material. The method provides high etch rates, good etch anisotropy and good etch uniformity. For example, for SBT and SBN thin films, the etch process provides etch rates in the range of 2.5 to 17.5 nm/min depending on the etch conditions and minimal etch residues at the end of the etch process is removed easily by low temperature (250° C.) baking. Also, the method provides good etch selectivity in the films and minimal surface damage.

19 Claims, 8 Drawing Sheets

DRY ETCHING OF LAYER STRUCTURE OXIDES

CROSS REFERENCE TO RELATED APPLICATIONS

This is a continuation-in-part of applications Ser. Nos. 08/300,176, now abandoned 08/300,177, abandoned, and 08/300,339, issued as U.S. Pat. No. 5,478,610 all filed on Sep. 2, 1994.

FIELD OF THE INVENTION

This invention relates to the field of thin film ferroelectric layer structure oxide, and a method of etching the same using dry etching processes such as reactive ion etching, for ferroelectric device applications such as capacitors, nonvolatile memories, sensors, displays, and transducers.

BACKGROUND OF THE INVENTION

Ferroelectric materials are characterized primarily by a spontaneous polarization, the orientation of which can be reversed by an electric field. In addition, these materials also display unique dielectric, pyroelectric, piezoelectric and electro-optic properties that are utilized for a variety of applications such as capacitors, dielectric resonators, heat sensors, transducers, actuators, nonvolatile memories, optical waveguides and displays. For device applications, however, it is useful to fabricate ferroelectric materials in the form of thin films so as to exploit these properties and the design flexibility of thin film geometries. Ferroelectric thin films can be deposited using different techniques such as physical vapor deposition, chemical vapor deposition and chemical solution processes including sol-gel and metalorganic decomposition.

Although ferroelectric materials have found a number of applications in several demonstrative ferroelectric devices, the primary impetus of recent activity in ferroelectric thin films is the large demand for commercial nonvolatile memories. The polarization in a ferroelectric shows hysteresis with the applied electric field; at zero field, there are two equally stable states of polarization, + or $-P_r$, as shown in FIG. 1. This type of behavior enables a binary state device in the form of a ferroelectric capacitor (metal-ferroelectric-metal) that can be reversed electrically. Either of these two states could be encoded as '1' or '0' in a computer memory and since no external field (power) is required to maintain the state of the device, it can be considered a nonvolatile memory device. To switch the state of the device, a threshold field (coercive field) greater than + or $-E_c$ is required. In order to reduce the required applied voltage, the ferroelectric materials need to be processed in the form of thin films. Integration of ferroelectric thin film capacitors into the existing VLSI results in a true nonvolatile random access memory device (see J. F. Scott and C. A. Paz de Araujo, Science, 246, (1989), 1400–1405). In addition to the non-volatility, ferroelectric random access memories (FRAMS) also offer high switching speeds, low operating voltage (<5 V), wide operating temperature range and high radiation hardness. Furthermore, the ferroelectric thin films, electrodes and passivation layers can be deposited in separate small facilities thereby obviating the need for any changes in the existing on-line Si or GaAs VLSI production. In principle, FRAMS could eventually replace static RAMS (SRAMs) in the cache memory, dynamic RAMs (DRAMs) in the main system memory and electrical erasable programmable read only memories (EEPROMs) in look-up tables.

Although ferroelectric thin films offer great potential for nonvolatile RAMs, commercial usage has been hindered largely by serious degradation problems such as fatigue, leakage current and aging that affect the lifetime of ferroelectric devices. A common source for these degradation properties in oxide ferroelectrics is the presence of defects such as oxygen vacancies in the materials. Considering the problem of fatigue, ferroelectrics are noted to lose some of their polarization as the polarization is reversed. This is known as fatigue degradation and is one of the prime obstacles to forming high quality ferroelectric thin films. The hysteresis loop "shrinks" on account of fatigue and finally after a large number of cycles it is difficult to distinguish between a '1' and a '0' in the memory device, thus rendering it ineffective. Fatigue (see I. K. Yoo and S. B. Desu, Mat. Sci. and Eng., B13, (1992), 319; I. K. Yoo and S. B. Desu, Phys. Stat. Sol., a133, (1992), 565; I. K. Yoo and S. B. Desu, J. Int. Mat. Sys., 4, (1993), 490; S. B. Desu and I. K. Yoo, J. Electrochem. Soc., 140, (1993), L133) occurs because of both the relative movement of oxygen vacancies and their entrapment at the electrode/ferroelectric interface (and/or at the grain boundaries and domain boundaries). These defects are created during the processing of ferroelectric films (with the desired ferroelectric phase). Under an externally applied a.c. field (required to cause polarization reversal), the oxygen vacancies have a tendency to move towards the electrode/ferroelectric interface as a result of the instability of the interface. Eventually, these defects are entrapped at the interface and cause structural damage. This results in a loss of polarization in the material.

There are two possible solutions to overcome fatigue and other degradation problems. The first is to reduce the tendency for entrapment by changing the nature of the electrode/ferroelectric interface. Multilayer electrode structures using ceramic electrodes such as $RuO_2$ which minimize oxygen vacancy entrapment have been used to minimize fatigue problems in oxide ferroelectrics (see U.S. patent application Ser. No. 08/104,861 filed Aug. 8, 1993). The second solution involves the control of defect density. The extrinsic point defect concentration may be minimized by reduction of impurity concentration or through compensation of impurities. La and Nb doping are known to reduce the fatigue rate of PZT thin films on Pt electrodes by compensating for the vacancies (see S. B. Desu, D. P. Vijay and I. K. Yoo, Mat. Res. Soc. Symp., 335, (1994), 53). The strategies for minimizing the intrinsic defect concentration may include choosing compounds with inherently high defect formation energies or choosing compounds that have no volatile components in their sublattice exhibiting ferroelectric properties. Thus, another alternative to overcome fatigue and other degradation problems is to use a ferroelectric compound that does not contain any volatile components in its sublattice that exhibits ferroelectric properties. This criterion is satisfied by many of the known layered structure ferroelectric oxides.

In the layer-structure family, a large number of compounds of the general form $(Bi_2O_2)^{2+}$ $(M_{n-1}R_nO_{3n+1})^{2-}$, where M=Ba, Pb, Sr, Bi, K or Na, n=2, 4 or 5 and R=Ti, Nb or Ta, are known to be ferroelectric (see E. C. SubbaRao, J. Phys. Chem. Solids, 23, (1962), 665; B. Aurivillius, Arkiv Kemi 1[54], (1949), 463; E. C. SubbaRao, J. Chem. Phys., 34[2], (1961), 695; G. A. Smolenski, V. A. Isupov and A. I. Agranovskaya, Fiz Tverdogo Tela, 3[3], (1961), 895). These compounds have a pseudo-tetragonal symmetry and the structure is comprised of stacking of n perovskite-like units of nominal composition $MRO_3$ between $Bi_2O_2$ layers along the pseudo-tetragonal c-axis. A large number of these compounds do not contain any volatile components in their sublattice that exhibit spontaneous polarization. The tendency for formation of defects such as oxygen vacancies and thereby the degradation problems such as fatigue may thus be reduced.

Novel deposition processes for fabrication of thin film layer structure oxides have been disclosed earlier. However, for ferroelectric device applications, it is also necessary to develop a patterning technology for these devices. Memory devices such as dynamic and random access memories have decreased in size over the last two decades. As the capacity of memory cells has increased and the size has decreased, the design of the cells has become increasingly complex in order to preserve sufficient electrical capacitance to hold the electrical charge representing the data. To produce these complex shaped cells, it is first necessary to transfer the required geometric shape from a mask to the surface of the film to be patterned. This is accomplished by the process of lithography. In a typical lithographic process, a photosensitive polymer (photoresist) film is coated on top of the thin film layers (deposited on a substrate) to be patterned, dried and then exposed with the appropriate geometrical patterns through a photomask to ultraviolet or other radiation. The substrate holding the film layers is then soaked in a solution that develops the images in the photosensitive material. Depending on the type of the polymer used, either exposed or non-exposed areas of the polymer film are removed in the developing process. To produce circuit features, these resist patterns must be transferred into layers comprising the device. A preferred method of transferring the patterns is to selectively remove the unmasked portions of the layers comprising the device. This process is generally known as etching (see S. M. Sze, "VLSI Technology", McGraw-Hill Co., 1983).

Etching techniques can be broadly classified into wet and dry etching processes. Selectivity for wet etching is usally good, most of the time much better than dry etching. The main disadvantage of wet etching is poor line width control and limited resolution because it is essentially an isotropic etch resulting in an undercut of the mask equal to the thickness of the layer to be etched. Wet chemical etching processes are not popular in applications where complex patterning is required because of the low etch rates, poor etch anisotropy, poor uniformity and the poor selectivity that they provide. On the other hand, dry etching techniques are highly suitable for device applications because this patterning technology provide rapid rates of etching of the materials, high resolution so that it can be used in complex configurations, good selectivity so that the underlying materials are not etched when not required, and also provide uniform etching. Dry etching techniques comprise a whole class of etching processes that use plasmas in the form of low-pressure gas discharges to accomplish the etching process. Broadly, this method is comprised of techniques such as sputter etching, ion milling, plasma etching, reactive ion etching and reactive ion beam etching.

In the past, perovskite type ferroelectrics such as PZT and PLT have been etched by techniques such as laser-induced sputtering (see M. Eyett, D. Bauerie, W. Wersing and H. Thomann, J. Appl. Phys, 62, 1987, 1511), chemical wet etching (see H. T. Chung and H. G. Kim, Ferroelectrics, 76, 1987) and reactive ion etching (see M. R. Poor, A. M. Hurt, C. B. Fledermann and A. U. Wu, Mat. Res. Soc. Symp. Proc., 200, 1990). However, it is believed that the etching of layer structure oxides ferroelectrics has never been reported before. This may be because of an inability to identify an etching gas for the plasma that can meet the stringent conditions required for device applications. In the present invention, an etch gas is identified, $CHClFCF_3$, for dry etching of ferroelectric layered structure oxide thin films.

SUMMARY OF THE INVENTION

It is an object of the present invention to provide a reliable etching process for patterning layered structure oxide ferroelectric thin films for device applications such as nonvolatile memory devices, capacitors, optical displays, piezoelectric transducers, and surface acoustic wave devices. It is a more specific object of the present invention to provide a reliable etching process for patterning layered structure oxide ferroelectric thin films using $CHClFCF_3$ plasma as the etch gas. The process involves placing the layered structure oxide film, that is deposited suitably on a substrate, in a chamber; introducing the etch gas, $CHClFCF_3$, into the chamber; and producing a glow discharge (plasma) in the chamber to etch the material. Preferably, the layer structure oxide materials are $(Bi_2O_2)^{2+}$ $(M_{n-1}R_nO_{3n+1})^{2-}$, where M=Ba, Pb, Sr, Bi, K, or Na, n=2, 4 or 5 and R=Ti, Nb or Ta. Preferably, the glow discharge in the chamber is an a.c. discharge. Preferably, the substrate materials are Pt-coated silicon wafers ($Pt/Ti/SiO_2/Si$), RuOx—coated silicon wafers ($RuOx/SiO_2/Si$), sapphire or MgO. Preferably, the metallization in the devices is Pt, $MO_x$ (where M=Ru, Ir, Rh, Os etc.), YBCO (yttrium barium copper oxide), LSCO (lanthanum strontium cobaltate), Au, Pd, Al, or Ni.

DETAILED DESCRIPTION OF A PREFERRED EMBODIMENT

Figure 1:
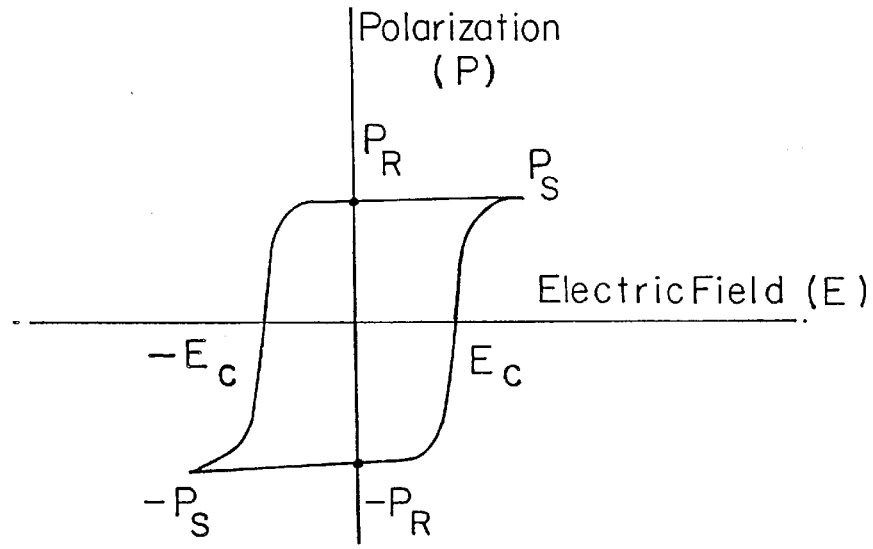
FIG. 1 shows typical hysteresis loop of a ferroelectric material.

Dry etching pattern transfer techniques essentially rely on partially ionized gases consisting of ions, electrons and neutral atoms created by low-pressure discharges (see S. M. Sze, "VLSI Technology", McGraw-Hill Co., 1983). When an electric field of sufficient magnitude is applied to a gas held in a chamber, it breaks down into activated species such as ions, atoms and free radicals to create a discharge. The potential energy (gained from the electrical energy supplied) of these species is then used for etching by physical and/or chemical interactions with the solid surfaces. In general, there are two different ways to produce a discharge: (a) dc discharge in which a dc potential is applied between two metal electrodes held in a partially evacuated atmosphere and (b) rf discharge in which an ac field is applied across the two electrodes held in partially evacuated atmosphere. Dry etching techniques such as ion milling, sputter etching, reactive ion etching (RIE), reactive ion beam etching and plasma etching as the common dry etching techniques, differ in the specifics of discharge conditions, type of gas, and the type of apparatus used. For example, sputter etching and ion beam etching are techniques that produce etching solely by physical sputtering. However, sputter etching uses an rf system while ion beam etching involves a dc system. Plasma etching involves pure chemical etching whereas in the reactive techniques such as RIE both physical and chemical reactions take place on the sample surface.

An etch process is basically qualified by (a) the etch rates it can provide for a given material, (b) the etch anisotropy or resolution which determines the kind of geometries that can be etched (c) etch selectivity and (d) etch uniformity. As mentioned previously, for device applications, it is necessary to use a process that can provide high etch rates, high anisotropy (vertical sidewall profiles), good etch selectivity (no damage to underlying layers or the mask) and good uniformity. Pure physical etch processes such as ion milling provide good anisotropy but at the expense of selectivity. On the other hand, pure chemical etch processes such as plasma etching provide excellent selectivity but the etch anisotropy is sacrificed. Reactive etch processes such as RIE are ideal candidates for device applications because they involve a combination of both physical and chemical reactions on the film surface. However, the suitability of these processes is critically determined by the nature of the etch gas used.

This invention provides a reliable method for patterning of layered structure oxide thin films. The process of invention is described, here, by relating it to the devices. The success of the processes of the present invention is demonstrated by describing one particular embodiment of the present invention (Reactive Ion Etching using $CHClFCF_3$ as the etch gas) in the context of patterning of one particular ferroelectric device (i.e., a ferroelectric capacitor for non-volatile memory applications) using a particular class of layered structure ferroelectric materials (i.e., $SrBi_2Ta_2O_9$ (SBT)–$SrBi_2Nb_2O_9$(SBN) solid solutions). It is emphasized that the particular embodiments shown in the drawings and within this specification are for the purposes of example and should not be construed to limit the invention described later in the claims. The processes of invention are simple to employ and are compatible with the current standard VLSI technology.

Figure 2:
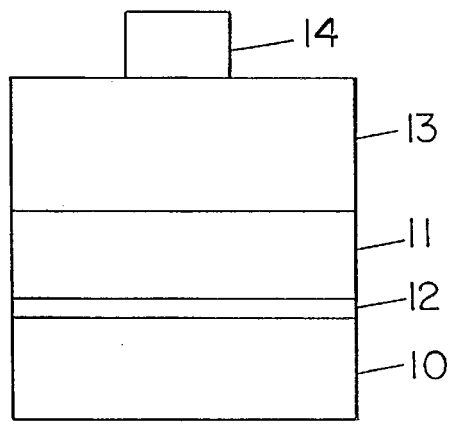
FIG. 2 shows a schematic drawing of a ferroelectric device structure used in one embodiment of the present invention.
Figure 3:
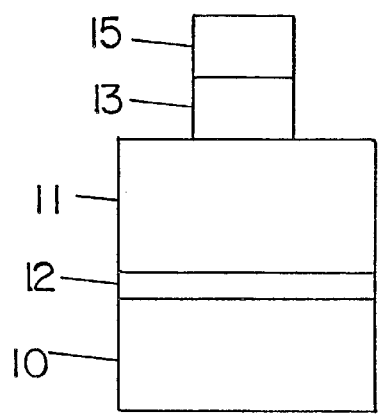
FIG. 3 shows a schematic drawing of a complete ferroelectric capacitor patterned by the processes of the present invention.

FIG. 2 shows a schematic of a ferroelectric thin film on a substrate coated with an electrode layer. The ferroelectric thin film 13 is a layered structure oxide coated on top of a substrate material 10 that may be silicon, a layer of silicon dioxide over a silicon chip, gallium arsenide, MgO, sapphire, etc. Of course, the substrate 10 may be a multilayer structure having various circuit elements formed on a silicon chip having layers of silicon dioxide, polysilicon, implanted silicon layers, etc. to form a complex integrated circuit. A thin electrode layer 11 separates the substrate from the ferroelectric thin film. The ferroelectric thin film and the electrode layer may be deposited by any of the standard physical vapor deposition processes or chemical processes on thin film deposition mentioned earlier. The bottom electrode materials may be metals such as Pt, Au, Pt or Pd, conducting oxides such as $MO_x$ (0<x<2), where M=Ru, Rh, Ir, Os or Re, conducting nitrides such as TiN and ZrN or superconducting oxides such as $YBa_2Cu_3O_{7-x}$, $Bi_2Sr_2Ca_2Cu_3O_{10}$, etc. If required, an intermediate adhesion layer 12 may be included to improve the adhesion between the bottom electrode and the substrate material. For example, in case of Pt on Si/SiO2 substrates, a thin Ti interlayer is added to improve the adhesion between Pt and $SiO_2$. A photoresist material is coated on this structure, exposed to UV light through a photomask containing the required geometric design and then soaked in a developing solution to remove the polymeric material from the exposed areas and to leave a mask 14 on the part of the ferroelectric film surface that is not to be etched. After the etching process, the mask may be removed by soaking the structure in a solvent of the polymeric material such as acetone. A top electrode 15 may be deposited on the ferroelectric film to form a ferroelectric capacitor structure as shown in FIG. 3. Once again, the materials of this top electrode 15 may either be the same as used for the underlying bottom electrode 11 or any combination thereof. If required, buffer layers may be added between the ferroelectric layer and the electrodes 11 and 15 at the bottom and top.

Figure 4:
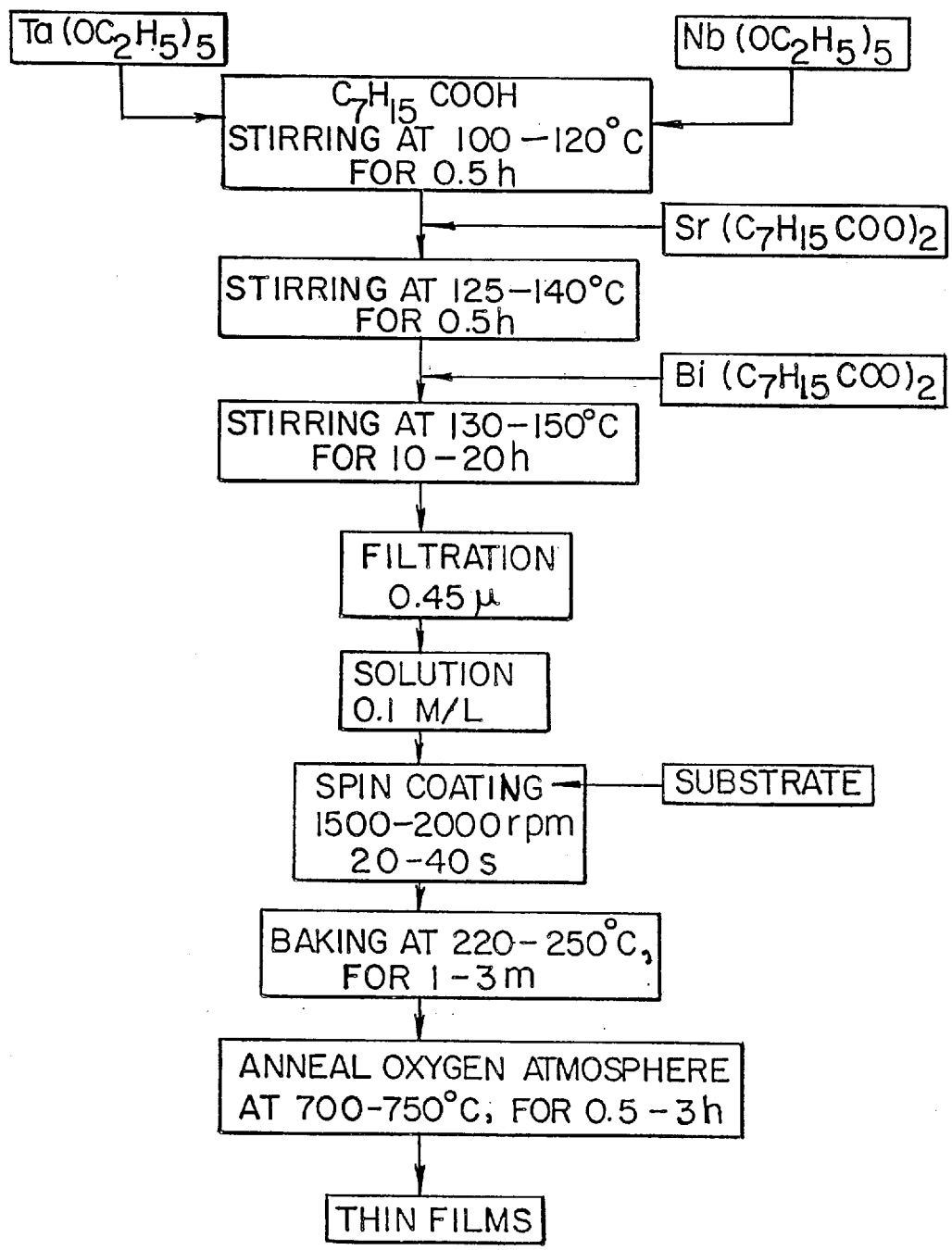
FIG. 4 shows a schematic drawing of the flow chart for preparing $SrBi_2(Ta_xNb_{2-x})O_9$, 0<x<2, films using the metalorganic decomposition process.

In a particular embodiment of the invention, $SrBi_2(Ta_xNb_{2-x})O_9$(SBTN) layered structure oxides with compositions between x=0 and x=2 are etched by the process of RIE using $CHClFCF_3$ as the etch gas. Thin films of these materials are deposited on $Si/SiO_2/Ti/Pt$ substrates (2 inches by 2 inches) to a thickness of 300 nm using the process of metalorganic decomposition (MOD) and spin coating. The as-deposited films are baked at 220° C. and later annealed in a controlled $O_2$ atmosphere at 750° C. for 3 hours to obtain the crystalline SBTN ferroelectric thin films. This substrate is chosen because of its popularity in nonvolatile random access memory applications. The precursors for the MOD process are strontium 2-ethylhexanoate ($Sr(C_7H_{15}COO)_2$, 99.8%), bismuth 2-ethylhexanoate ($Bi(C_7H_{15}COO)_3$, 99%), tantalum ethoxide ($Ta(OC_2H_5)_5$, 99.95%), niobium ethoxide ($Nb(OC_2H_5)_5$, 99.95%) and 2-ethyl hexanoic acid ($C_7H_{15}COOH$, 99%) with xylene as the solvent. A flow chart for the preparation of the starting materials are shown in FIG. 4. The details of the process of fabrication of these layered structure oxides according to the present embodiments and other embodiments are given in a prior art process (see: co-pending application Ser. No. 08/300,176 for "Physical Vapor Deposition of Layer Structure Oxides", and Ser. No. 08/300,177 for "Chemical Solution Processing of Layer Structure Oxides", the contents of which are hereby incorporated by reference.

Figure 5:
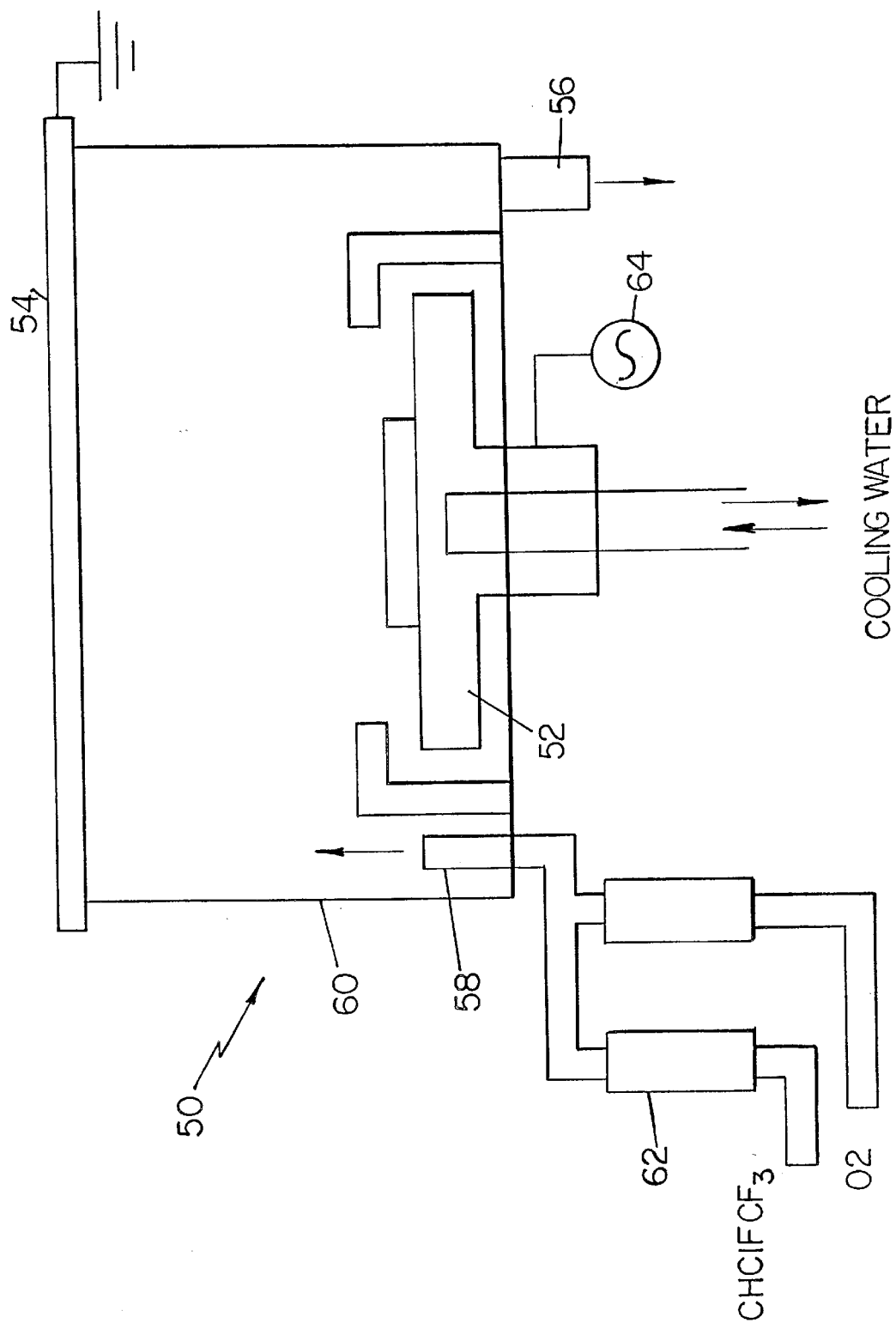
FIG. 5 shows a schematic drawing of a RIE chamber in which etching processes are performed.

Positive photoresist patterns (Shipley 1350J, 1.5 um) are used as the etching masks for SBTN thin films. A schematic of the RIE system used in the present embodiment is shown in FIG. 5. The RIE system 50 essentially consists of a cathode 52 and an anode 54 (two parallel metallic plates) separated by a distance of 5 cm. The cathode area is 113 $cm^2$. The system is connected to a mechanical pump 56 so as to evacuate the chamber to a low pressure ($-10^{-3}$ Torr) before sending the etch gases in through the gas inlet 58 shown. The flow of etch gas into the chamber 60 is regulated by a flow meter 62. The gas pressure inside the chamber 60 is dependent on the flow rate of the gas sent in. Both the cathode 52 and the etching samples are water cooled during the etching process. An rf generator 64 is used as the power supply source to generate the rf plasma across the electrodes. The process is initiated by placing the samples into the chamber and pumping the system down to a pressure of $10^{-3}$ Torr. After the etching, a predetermined amount of $CHClFCF_3$ gas is then sent into the chamber by controlling it through the flow meter. The gas pressure in the chamber is varied in the range of 25–125 mTorr. After obtaining a stable gas pressure in the chamber, an RF discharge with a power value of 150 W, is applied across the electrodes to begin the etching process. The end point of the etching process is observed directly with the naked eye. After the etching process is complete, the RF generator is switched off, the gas in flow is stopped and the chamber is backfilled with nitrogen to atmospheric pressure. The samples are removed from the chamber and the mask is stripped from the sample surface by cleaning the sample with an organic solvent such as acetone. The etch rates are determined by measuring the step heights created on the sample surface by a WYKO 3D surface profile meter and dividing it by the etching time.

Similar experiments can also be performed on Si/SiO$_2$/Ti/Pt/SBTN samples without any masking (plane wafer etching). These samples are analyzed qualitatively using x-ray photoelectron spectroscopy (XPS) for their surface composition before and after etching to determine if there are any residues on the surface after the etching process.

Figure 6A:
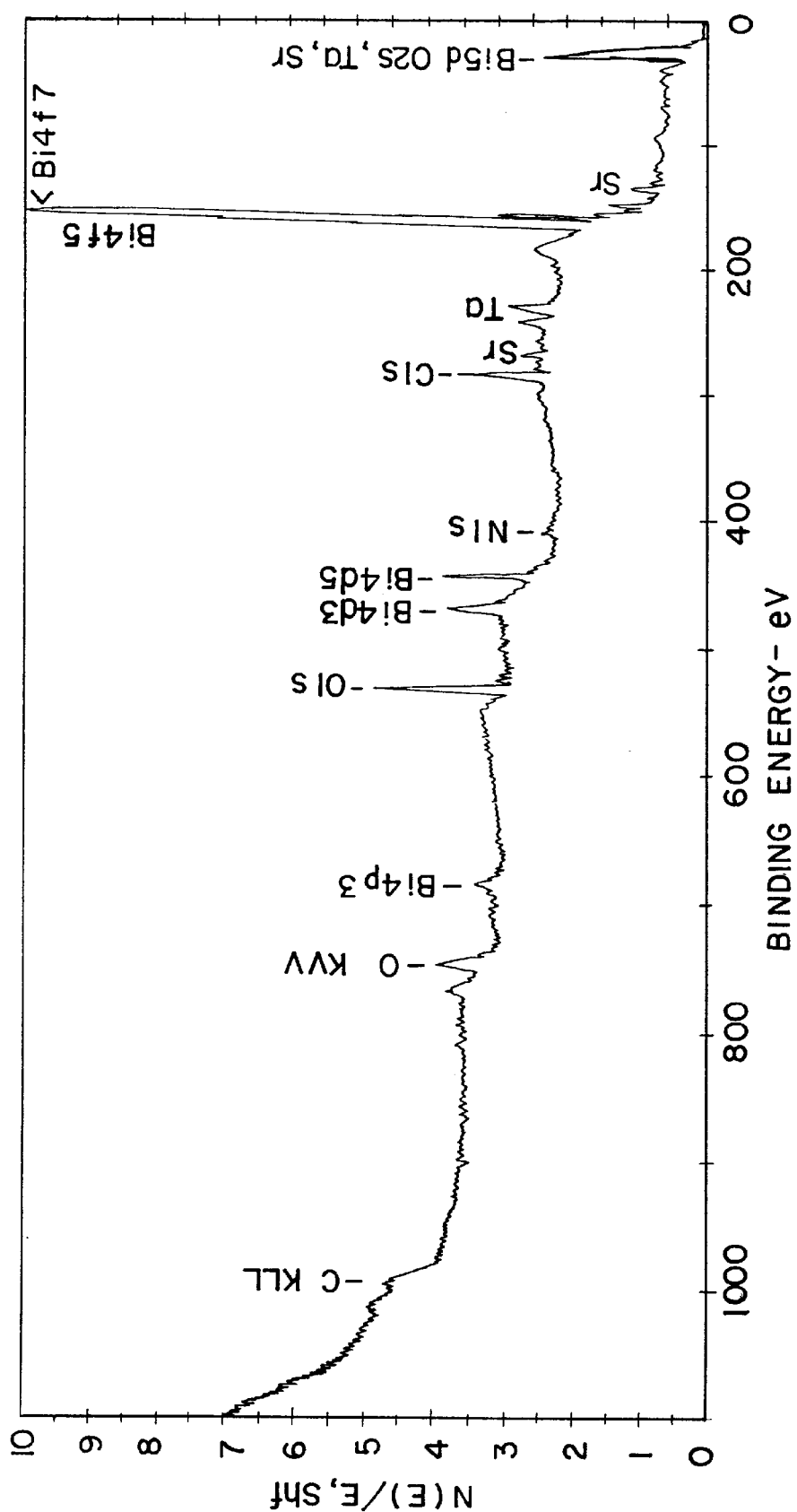
FIGS. 6a and 6b show XPS wide scan of $Si/SiO_2/Ti/Pt/$ SBTN samples before etching.
Figure 6B:
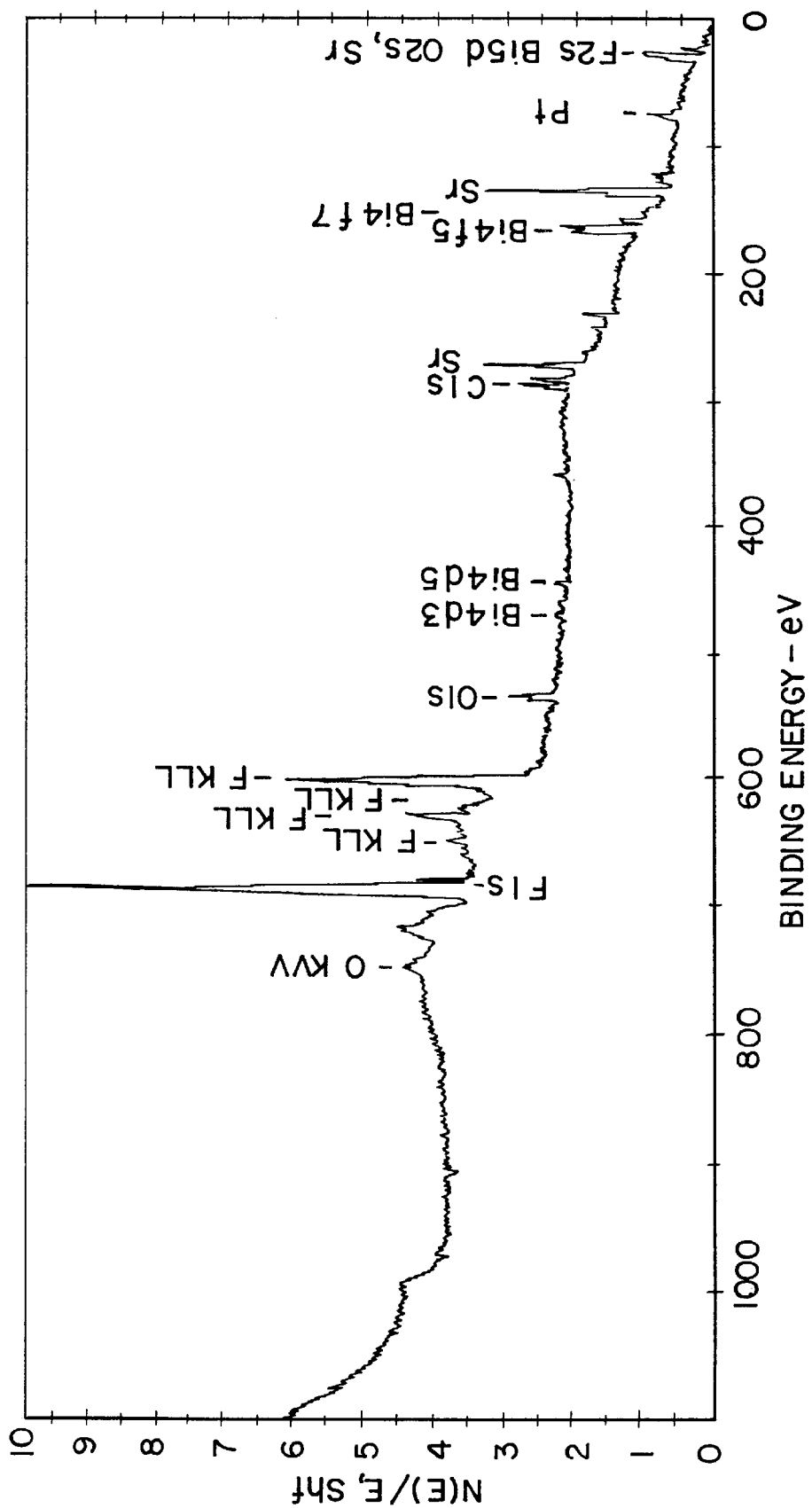
Figure 7A:
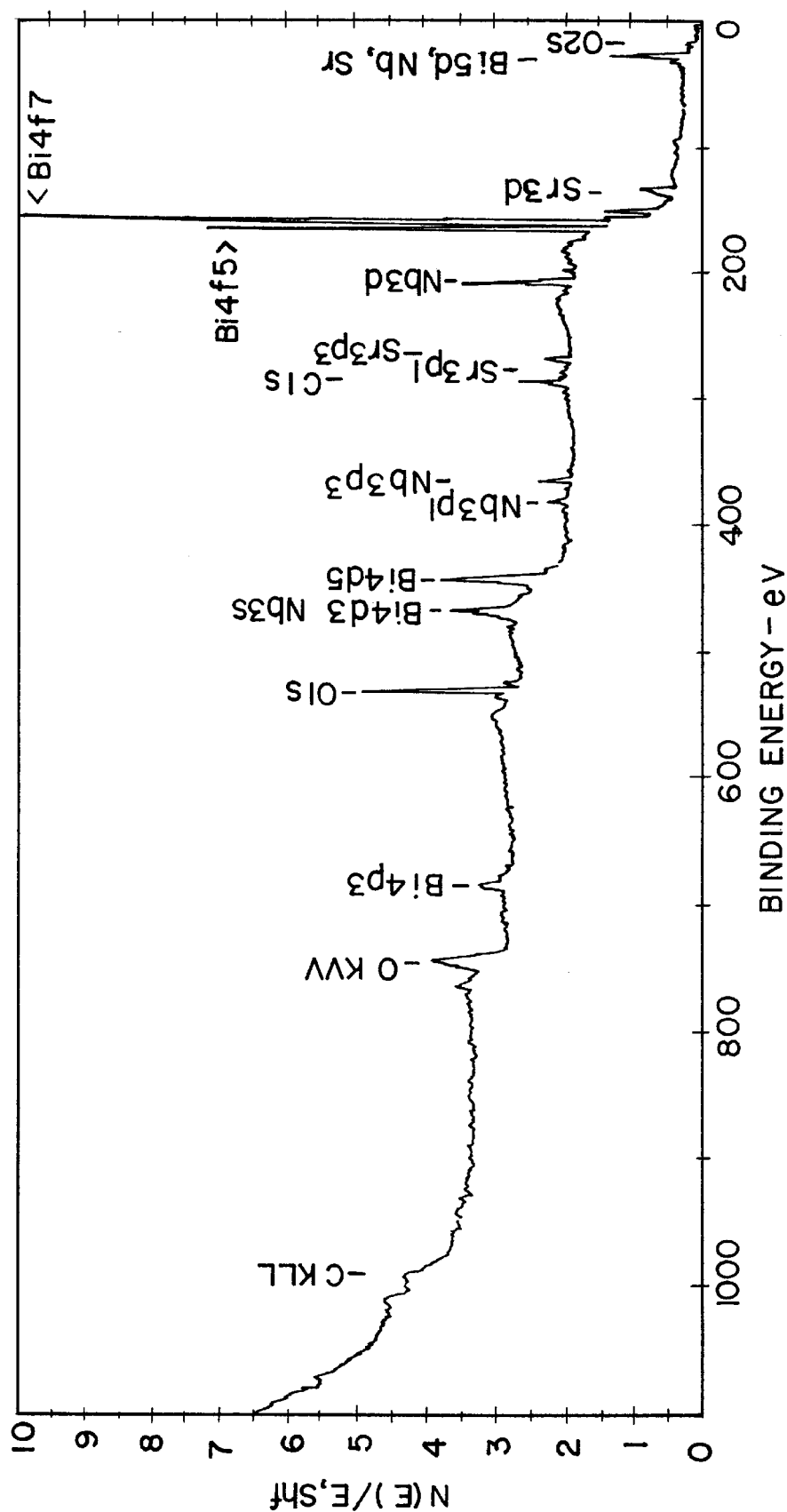
FIGS. 7a and 7b show XPS wide scan of $Si/SiO_2/Ti/Pt/$ SBTN samples after etching.
Figure 7B:
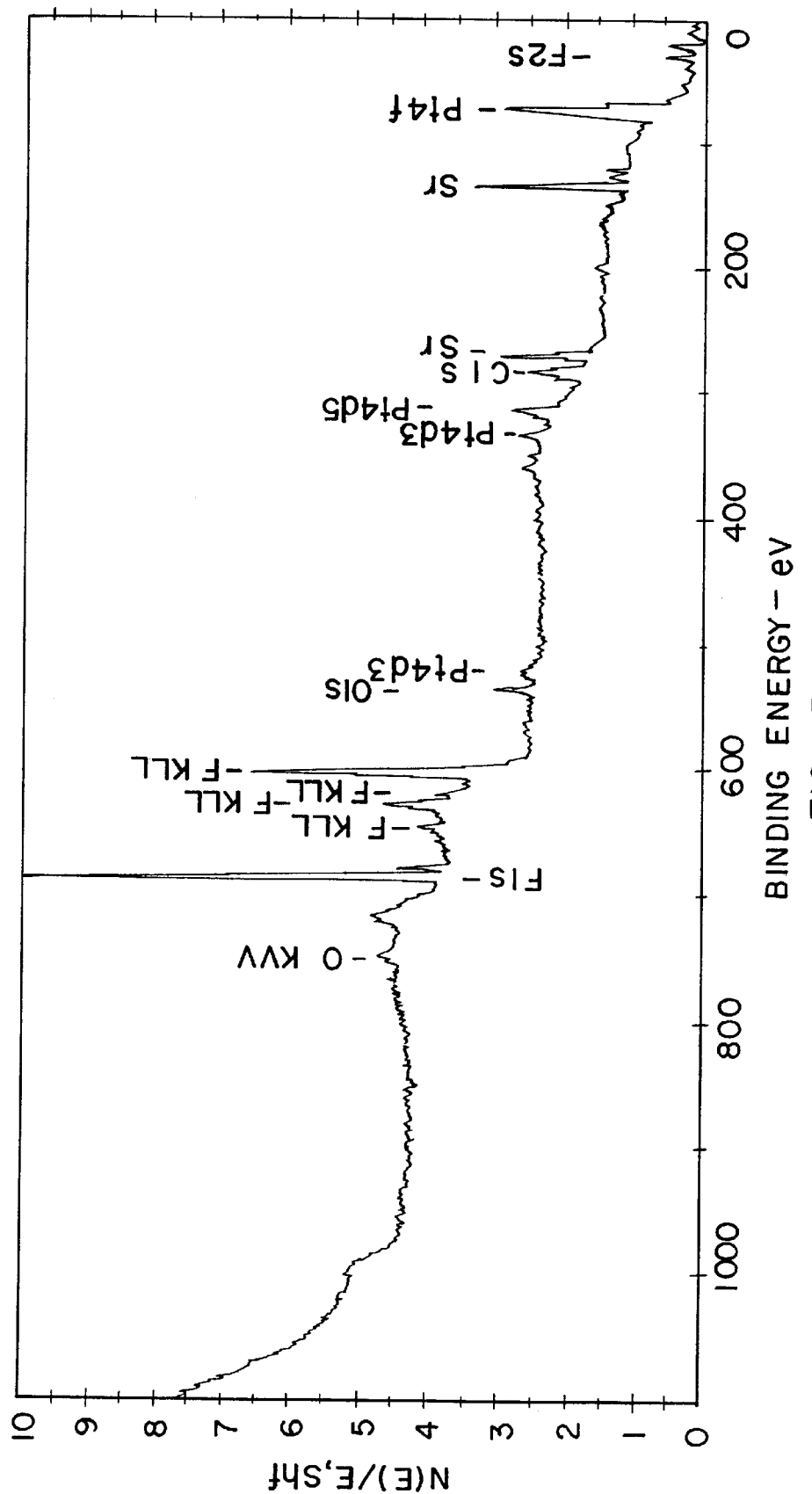
Figure 8:
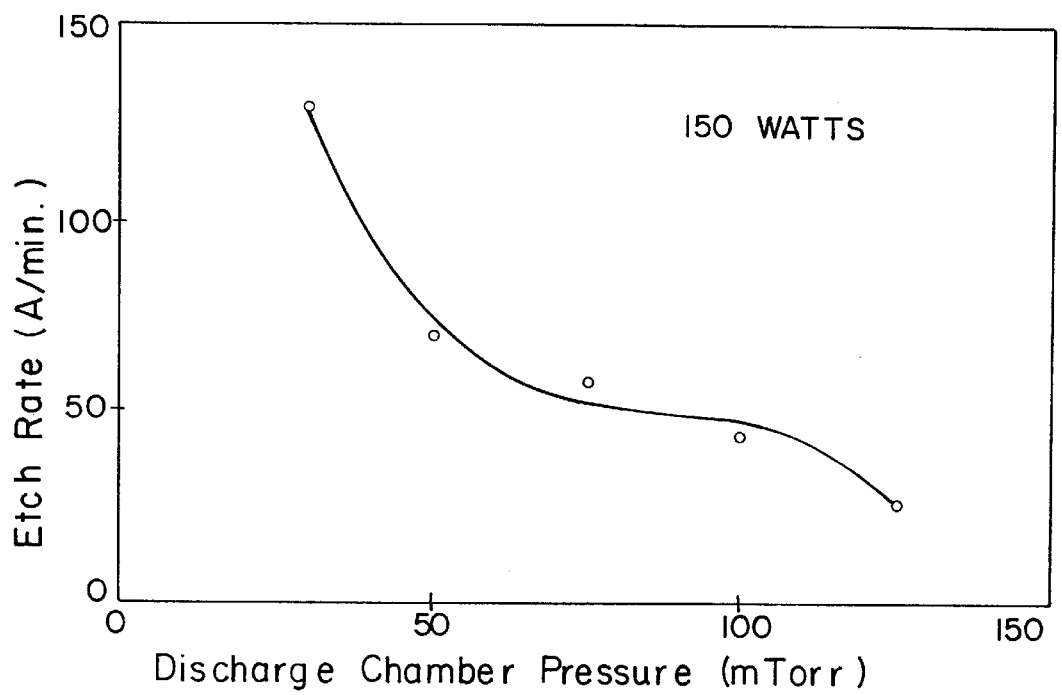
FIG. 8 shows the etch rate of SBT thin films as a function of gas pressure in the chamber.
Figure 9:
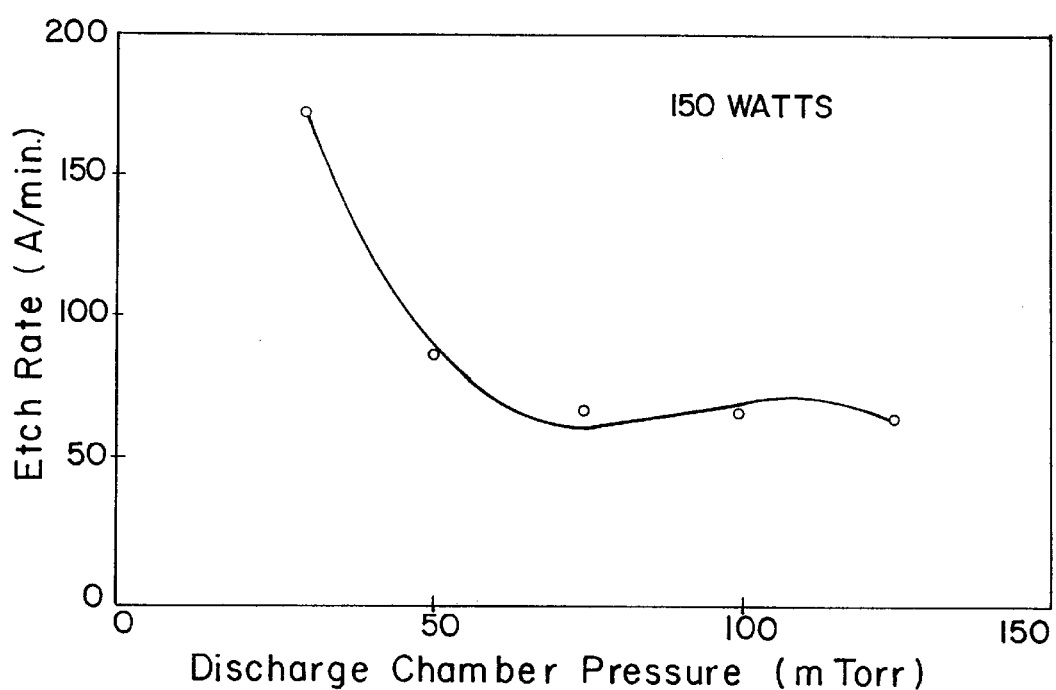
FIG. 9 shows the etch rate of SBN thin films as a function of gas pressure in the chamber.

FIGS. 6A and 6B are a typical XPS wide scan of the SBTN films before the etching process. FIGS. 7A and 7B are the XPS wide scan of the sample surface after the etching process. Comparison of these wide scans clearly shows that constituents of the SBTN films have been removed completely by the etching process. Additionally, the only residue present on the sample surface is fluorine. This is removed very easily by baking the etched sample at 200° C. The fluoride derivatives of the elements of the film have much lower vapor pressure than the chloride derivatives under regular and reduced pressure and therefore do not evaporate completely during the etching process. Fluorine was thus identified as the nonreactive radical in this particular case. The etch rate of SBTN films were determined as a function of gas pressure at a fixed RF power of 150 W. The results for SBT and SBN compositions are shown in FIGS. 8 and 9 respectively. In both cases, the general trend was an increase in etch rate with decreasing gas pressure. For SBT films, the etch rates obtained were in the range of 12.5–2.5 nm/min with the highest etch rate of 12.5 nm/min obtained at a gas pressure of 25 mTorr; for SBN films the etch rates were in the range of 17.5–5 nm/min and the highest value of etch rate obtained was 17.5 nm/min at a gas pressure of 25 mTorr. With increasing gas pressure in general, the mean free path of the atoms, ions and free radicals in the plasma decreases. Thus, the number of these species reaching the sample surface is reduced thereby decreasing the surface reactions required for the etching processes. The etch anisotropy and the etched surface morphology are observed for the various conditions of etching using SEM. It is found that under lower gas pressure and lower etching power conditions, the etched step tended to be more anisotropic. Also, the etched surface was more smooth under lower RF power conditions. In another experiment, the effect of O$_2$, added in various quantities to the etching gas, can be studied to determine its effect on the etching parameters such as etch rate and etch anisotropy. It is found that with increasing addition of O$_2$ to the etch gas mixture, the etch rate decreased. The presence of oxygen diluted the etch gas rather than increasing the reactive radical concentration and thus the decrease in etch rate. However, it is observed that the etched surface had a smoother morphology with increasing oxygen addition.

These results clearly indicate that the processes of invention have provided an effective method to etch ferroelectric layered structure oxide thin films. The particular embodiments described and shown in the drawings are for the purposes of example and should not be construed to limit the invention which will be described in the claims. The process may be applied to etch these materials on structures (may be with different dimensions) other than that described specifically (capacitors) in the present invention. The process may also be modified to add further processing steps. However, the basic inventive concept of the invention is still the same.

What is claimed is:

1. A method of etching a layered structure oxide ferroelectric thin film on a substrate by plasma assisted etching, comprising the steps of: placing the substrate into a chamber, introducing CHClFCF$_3$ gas; to the chamber and producing a glow discharge in the chamber to etch the layered structure oxide ferroelectric thin film.

2. The method of claim 1, wherein the glow discharge is produced by radio frequency.

3. The method of claim 2, wherein the radio frequency has an associated rf power of between 125 and 200 W.

4. The method of claim 1, wherein the glow discharge is a dc glow discharge.

5. The method of claim 1, wherein an additive gas is included in the chamber.

6. The method of claim 5, wherein said additive gas is at least one of oxygen or a noble gas.

7. The method of claim 6, wherein said additive gas is oxygen.

8. The method of claim 7, wherein the oxygen content in the chamber is between 5–50% inclusive of the total gas content.

9. The method of claim 1, wherein the chamber has a gas pressure, the gas pressure being less than 200 mTorr.

10. The method of claim 9, wherein the chamber has a gas pressure, the gas pressure being less than 125 mTorr.

11. The method of claim 1, wherein said layered structure oxide ferroelectric thin film comprises SrBi$_2$(Ta$_x$Nb$_{2-x}$)O$_9$ (SBTN) with composition x between 0 and 2 inclusive.

12. The method of claim 11, wherein said layered structure oxide ferroelectric thin film is at least one of the compounds with the formula $(Bi_2O_2)^{2+}(M_{n-1}R_nO_{3n+1})^{2-}$, where M=Ba, Pb, Sr, Bi, K, or Na; n=2, 4 or 5 and R=Ti, Nb or Ta.

13. The method of claim 11, wherein said substrate is one of: a semiconductor composed of at least one of Si, Si/SiO$_2$ or GaAs; a single crystal insulator composed of at least one sapphire, ZrO$_2$, MgO, SrTiO$_3$, BaTiO$_3$ or PbTiO$_3$; or an integrated circuit.

14. The method of claim 13, wherein said substrate is coated with a conducting material comprised of at least one of: a metal electrode; a conducting oxide electrode of MO$_x$ (0<x<2) where M is at least one of Ru, Rh, Ir, Os, Re or lanthanum strontium cobaltate (LSCO); a conducting nitride electrode; or a superconducting oxide.

15. The method of claim 14, wherein said substrate and said conducting material coating said substrate are separated by an adhesion layer.

16. The method of claim 1, wherein said layered structure oxide ferroelectric thin film is at least one of SrBi$_2$Ta$_2$O$_9$ (SBT) or SrBi$_2$Nb$_2$O$_9$(SBN).

17. A method of patterning a material, wherein the material comprises a layered structure oxide ferroelectric thin film of SrBi$_2$Ta$_2$O$_9$(SBT) or SrBi$_2$Nb$_2$O$_9$(SBN) and a substrate of Si/SiO$_2$/Ti/Pt, comprising:

applying a mask over the material so that the mask covers a portion of the material and leaves an exposed portion of the material; placing the material with the applied mask into a chamber; introducing CHClFCF$_3$ gas into the chamber; and producing a glow discharge in the chamber to etch the exposed portion of the material.

18. The method of claim 17, wherein the glow discharge is produced by radio frequency.

19. The method of claim 17, further comprising a step of introducing O$_2$ gas into the chamber as an additive gas.

* * * * *